United States Patent
Mischik, Jr. et al.

(10) Patent No.: US 9,297,494 B1
(45) Date of Patent: Mar. 29, 2016

(54) DAGGER PIN INTERFACE APPARATUS WITH SWIVEL PIN

(71) Applicant: The Boeing Company, Chicago, IL (US)

(72) Inventors: Joseph E. Mischik, Jr., Scottsdale, AZ (US); Morgan Foth, Gilbert, AZ (US)

(73) Assignee: The Boeing Company, Chicago, IL (US)

( * ) Notice: Subject to any disclaimer, the term of this patent is extended or adjusted under 35 U.S.C. 154(b) by 366 days.

(21) Appl. No.: 14/012,693

(22) Filed: Aug. 28, 2013

(51) Int. Cl.
*A47F 5/00* (2006.01)
*F16M 11/04* (2006.01)
*F16B 2/06* (2006.01)
*F16M 13/02* (2006.01)

(52) U.S. Cl.
CPC .................. *F16M 11/04* (2013.01); *F16B 2/06* (2013.01); *F16M 13/02* (2013.01)

(58) Field of Classification Search
CPC combination set(s) only.
See application file for complete search history.

(56) References Cited

U.S. PATENT DOCUMENTS

| | | | | |
|---|---|---|---|---|
| 2,871,457 A * | 1/1959 | Jencks | H05K 7/1407 174/50 |
| 3,710,476 A * | 1/1973 | Hollingsead | H05K 7/183 248/27.1 |
| 4,502,656 A * | 3/1985 | Zeitler | F16M 11/04 248/346.03 |
| 5,190,241 A * | 3/1993 | Pease | H05K 7/1412 174/541 |
| 5,285,353 A * | 2/1994 | Buck | H05K 7/142 174/250 |
| 5,297,684 A * | 3/1994 | Meunier | H05K 7/1412 138/173 |
| 5,312,264 A * | 5/1994 | Thomas | H01R 13/631 439/247 |
| 5,333,097 A * | 7/1994 | Christensen | G11B 33/126 361/679.35 |
| 5,466,171 A * | 11/1995 | Bixler | H01R 13/64 439/378 |
| 5,566,840 A * | 10/1996 | Waldner | G03F 9/00 211/41.17 |
| 6,606,789 B2 * | 8/2003 | Jansson | H05K 3/303 29/593 |
| 6,797,879 B2 * | 9/2004 | Leyda | H05K 7/20563 174/153 G |
| 6,954,940 B2 * | 10/2005 | Hsu | G06F 1/181 361/679.36 |
| 7,201,594 B2 * | 4/2007 | van der Mee | H01R 13/6315 439/247 |
| 7,419,394 B2 * | 9/2008 | Jensen | H01R 13/6315 439/248 |
| 7,508,660 B2 * | 3/2009 | Lin | G06F 1/183 361/679.4 |
| 8,107,257 B2 * | 1/2012 | Moorehead, Jr. | H05K 7/1412 361/801 |
| 2007/0062432 A1 * | 3/2007 | Huang | F16M 11/04 114/93 |
| 2012/0219244 A1 * | 8/2012 | Boeing | F16C 23/02 384/130 |

* cited by examiner

*Primary Examiner* — Monica Millner
(74) *Attorney, Agent, or Firm* — Joseph M. Rolnicki; Evans & Dixon, L.L.C.

(57) ABSTRACT

A dagger pin interface apparatus with a swivel pin is used in removably mounting a device on a structure where one of the apparatus pins is stationary relative to the structure and a second of the apparatus pins swivels relative to the structure when mounting the device to the structure. When mounting the device to the structure the one stationary pin can be aligned with and inserted into one mounting hole of the device and the second swiveling pin can engage in, pivot and move into a second mounting hole in the device when the second mounting hole is not completely aligned with the second pin.

19 Claims, 7 Drawing Sheets

DAGGER PIN INTERFACE APPARATUS WITH SWIVEL PIN

This disclosure was made with government support under contract W58RGZ-05-C-0001 awarded by the Department of Defense. The government has certain rights in the disclosure.

FIELD

The present disclosure pertains to a dagger pin interface apparatus having a pair of dagger pins that are positioned to engage in a pair of mounting holes in a surface of a device when removably mounting the device to a structure. More specifically, the present disclosure pertains to a dagger pin interface apparatus used in removably mounting a device on a structure where one of the pins is stationary relative to the structure and a second of the pins swivels relative to the structure when mounting the device to the structure. When mounting the device to the structure the one stationary pin can be aligned with and inserted into one mounting hole of the device and the second swiveling pin can engage and move into a second mounting hole in the device that is not completely aligned with the second pin.

BACKGROUND

Avionic boxes and other similar types of electronic devices that are removably mounted in clusters to a structure typically contain two mounting holes in a rear surface of the device that engage over two fixed pins on the structure. When the device is removably mounted to the structure it is inserted between previously mounted devices or other equipment until each of the two mounting holes slide over one of two fixed pins on the structure. This is often referred to as a dagger pin interface. Latches on the opposite front surface of the device are engaged with swing bolts on the structure and the swing bolts are tightened down on the latches. The engagement of the two fixed pins in the two mounting holes in the rear surface of the device and the swing bolts tightened down on the latches on the front surface of the device keep the device in place.

Due to tolerancing, it is often necessary that one of the two holes in the rear surface of the device be a slot. The slot is positioned on the rear surface with its major axis intersecting the center of the other hole. The hole and the slot in the rear surface of the device permit variations in the size of the dagger pins, the locations of the dagger pins or distance of the dagger pins from each other.

However, in many instances a slot is not provided in the rear surface of the device. When two holes are provided in the rear surface of the device and both holes do not align with the pair of dagger pins on the structure to which the device is being removably mounted, special procedures must be employed or the rear surface of the device must be modified to removably mount the device to the structure using the dagger pins. Mechanical interfaces for these devices must be designed which are costly and time consuming. A design change of the device to removably mount the device to the structure at this stage of the manufacturing process can be significantly expensive.

What is needed is an apparatus that eliminates any need for a custom installation of a removable device to a structure using dagger pins and which provides a tolerance range between the dagger pins that accommodates a device having mounting holes with a tolerance that is outside the range originally designed for the dagger pins.

SUMMARY

The apparatus of the disclosure overcomes the disadvantages associated with prior art dagger pin arrangements employed in removably mounting a device to another structure. The apparatus employs a pair of dagger pins or mounting pins where one of the two mounting pins can move relative to the other. This enables the movable mounting pin to engage in and move into a mounting hole in the device being removably mounted to the structure even when the mounting hole is not completely aligned with the movable pin.

The apparatus includes a base that is attachable to a structure to which a device is to be removably attached. When attached to the structure the base is secured stationary relative to the structure.

A first dagger or mounting pin is connected stationary to the base. The first pin projects outwardly from the base to a distal end surface of the first pin. When the base is attached to the structure, the first pin projects outwardly and away from the structure. The distal end surface of the first pin has a tapered or conical configuration and it is positioned on the base where the distal end surface will engage in and move into a first mounting hole of the device being removably mounted to the structure.

A second dagger or mounting pin is connected to the base for pivoting movement of the second pin about a pivot axis relative to the base. The pivot axis is oriented vertically and the second pin can swivel about the pivot axis from side to side toward and away from the first pin. The second pin projects outwardly from the base to a distal end surface of the second pin. When the base is attached to the structure, the second pin projects outwardly and away from the structure. The distal end surface of the second pin has a tapered or conical configuration and is positioned on the base where the second pin distal end surface will engage in, pivot toward and move into a second mounting hole in the device even when the second mounting hole is not completely aligned with the second pin.

A biasing device is provided on the second pin that urges the second pin to a neutral position where the first and second pins are substantially aligned or parallel. When the second pin is pivoted about the pivot axis away from the neutral position, the pivoting movement is resisted by the biasing device.

When employing the apparatus for removably mounting a device to a structure where the device has first and second mounting holes in a rear surface of the device, the base of the apparatus is first securely attached stationary to the structure. The rear surface of the device is then positioned relative to the base where one mounting hole in the device rear surface is aligned with the first pin of the apparatus. The second mounting hole in the device rear surface may or may not be completely aligned with the second pin of the apparatus. The device is then moved onto the first and second pins where the first mounting hole in the device rear surface passes over the first pin of the apparatus. This movement of the device onto the first pin will cause the second mounting hole in the rear surface of the device to engage with the distal end surface of the second pin and slide over the distal end surface of the second pin. If the second mounting hole is not completely aligned with the second pin, the tapered distal end surface of the second pin will cause the second pin to pivot about its pivot axis as the second mounting hole is passed over the second pin.

With the first and second pins of the apparatus engaged in the respective first and second mounting holes of the device, latches on the opposite front surface of the device can be engaged with swing bolts on the structure. The swing bolts can then be tightened down on the laches to removably mount the device to the structure.

The features, functions, and advantages that have been discussed can be achieved independently in various embodiments or may be combined in yet other embodiments further details of which can be seen with reference to the following description and drawings.

DETAILED DESCRIPTION

Figure 1:
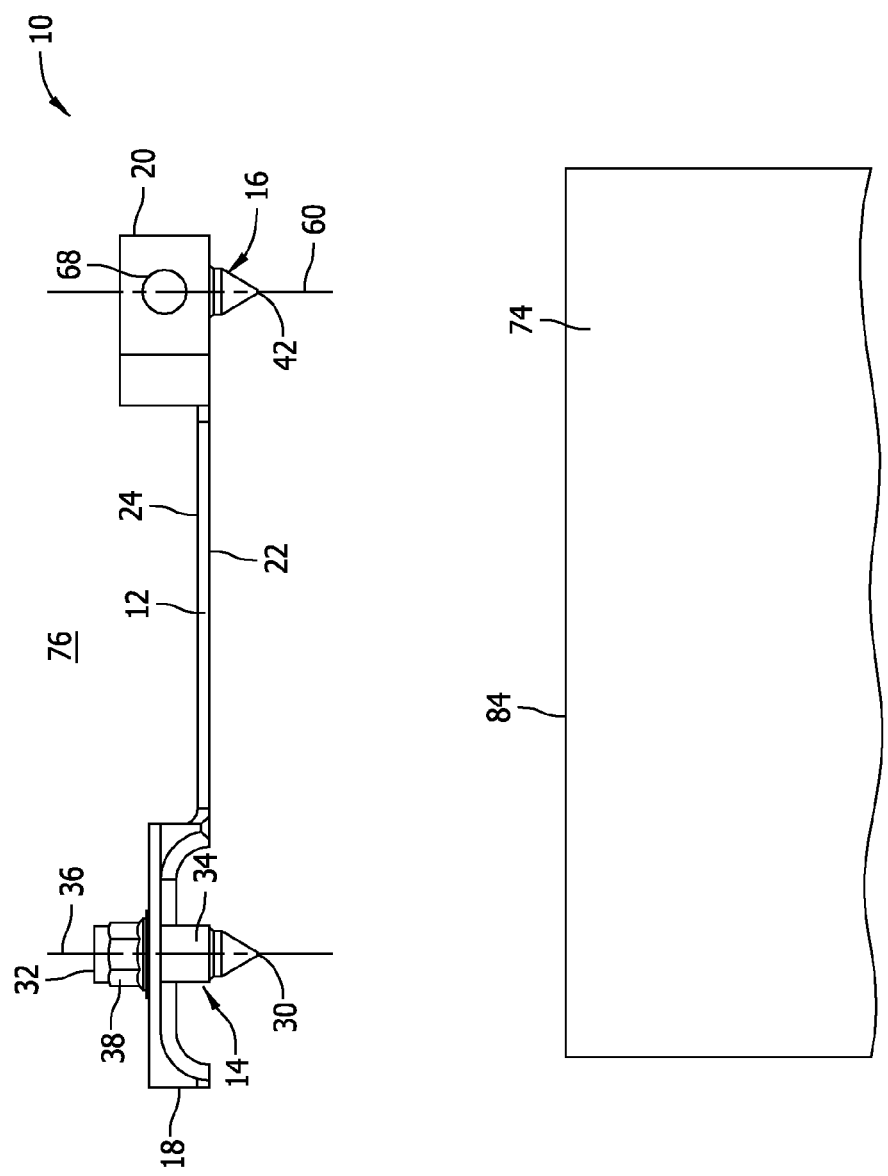
FIG. 1 is a top plan view of the dagger pin interface apparatus with a swivel pin.
Figure 2:
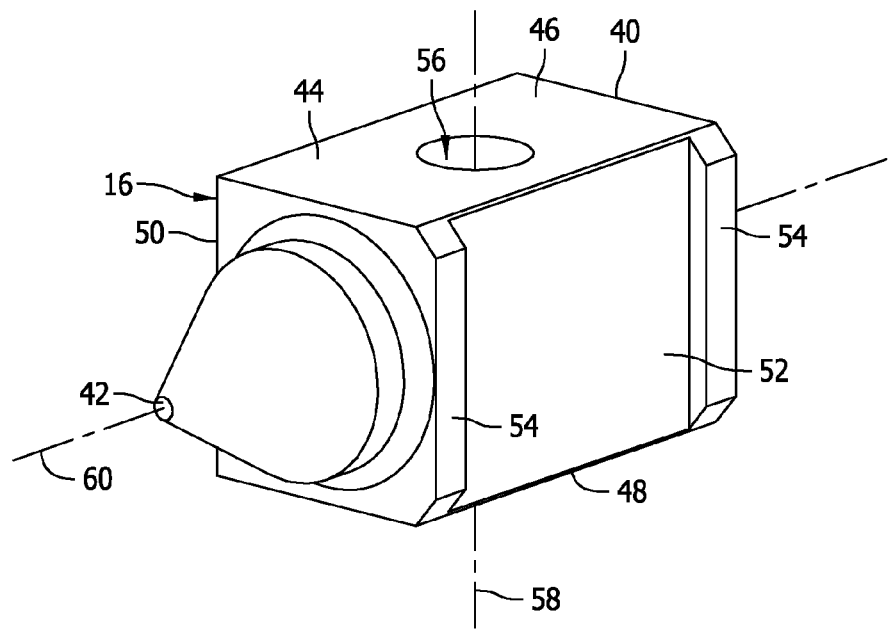
FIG. 2 is a perspective view of the swivel pin removed from the apparatus.
Figure 3:
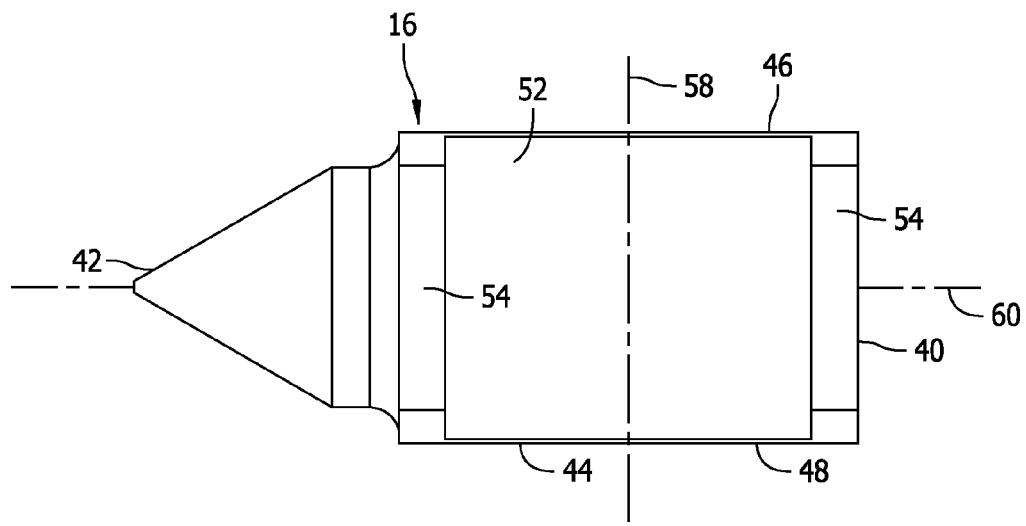
FIG. 3 is a side elevation view of the swivel pin.
Figure 4:
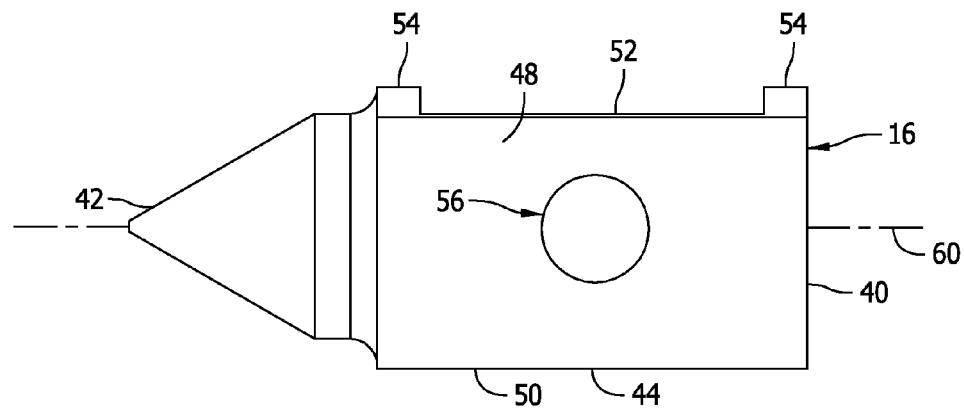
FIG. 4 is a bottom plan view of the swivel pin.
Figure 6:
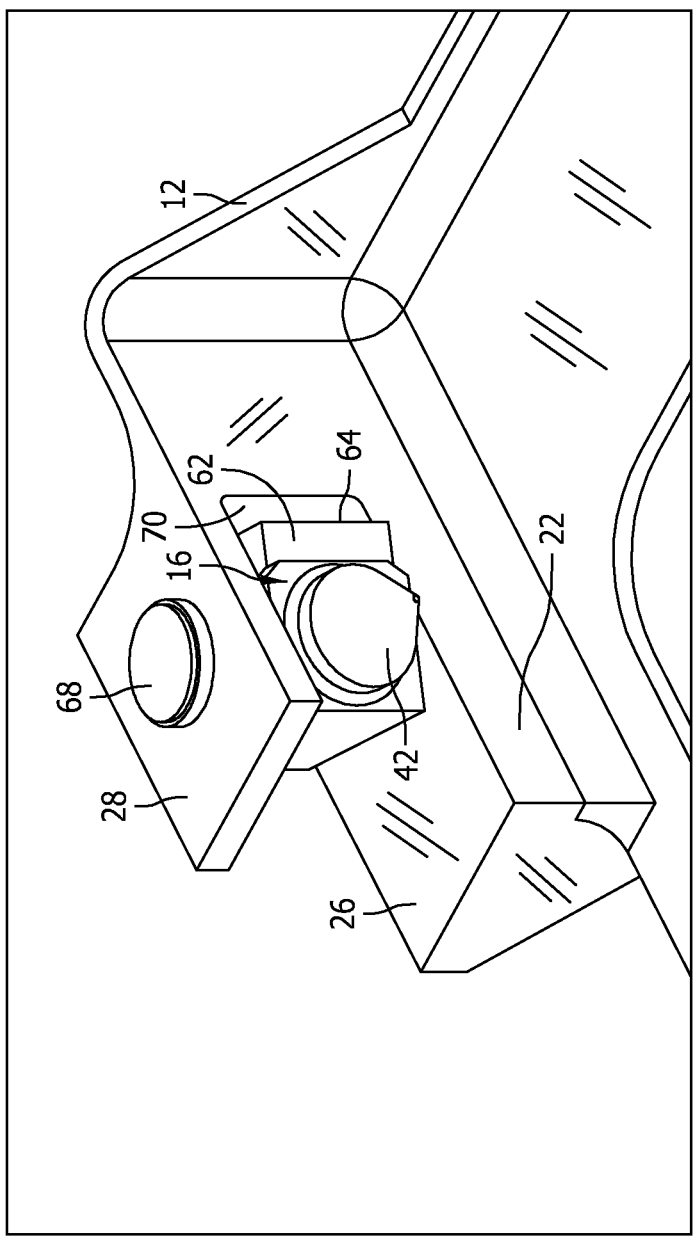
FIG. 6 is a partial perspective view of the apparatus swivel pin in a deflected position of the swivel pin.
Figure 8:
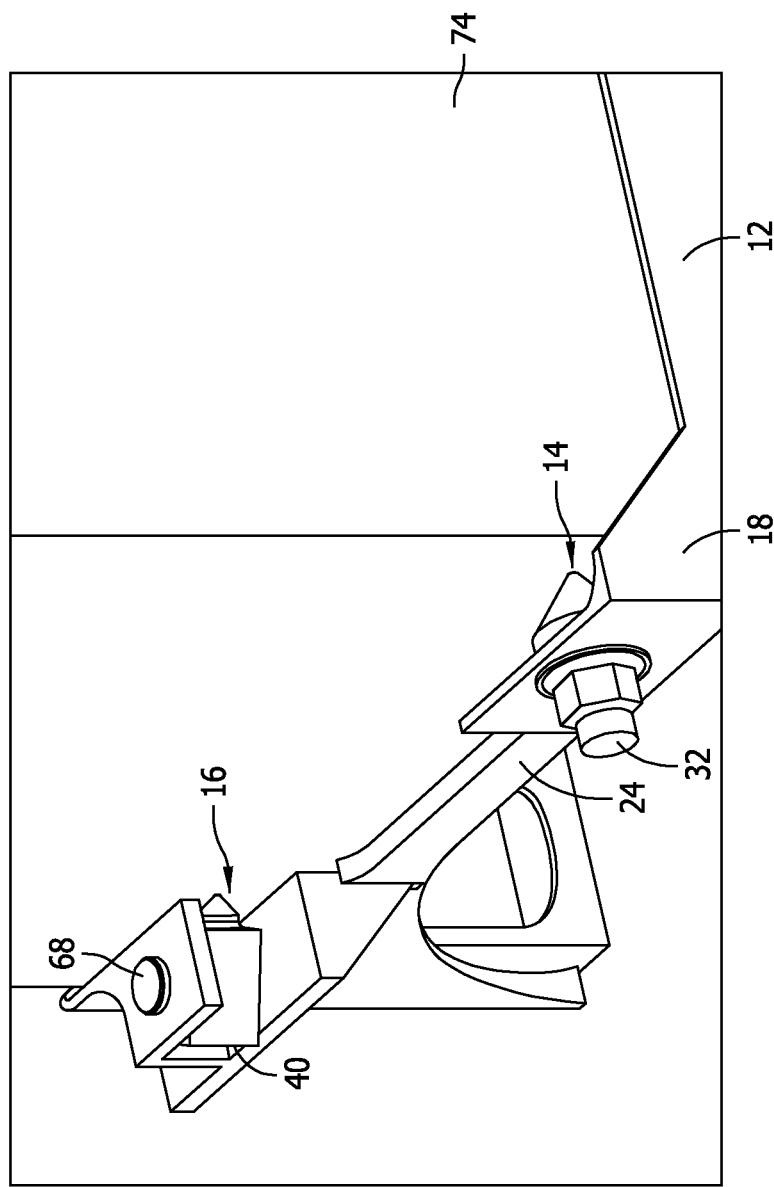
FIG. 8 is a perspective view of the rear of the apparatus.
Figure 9:
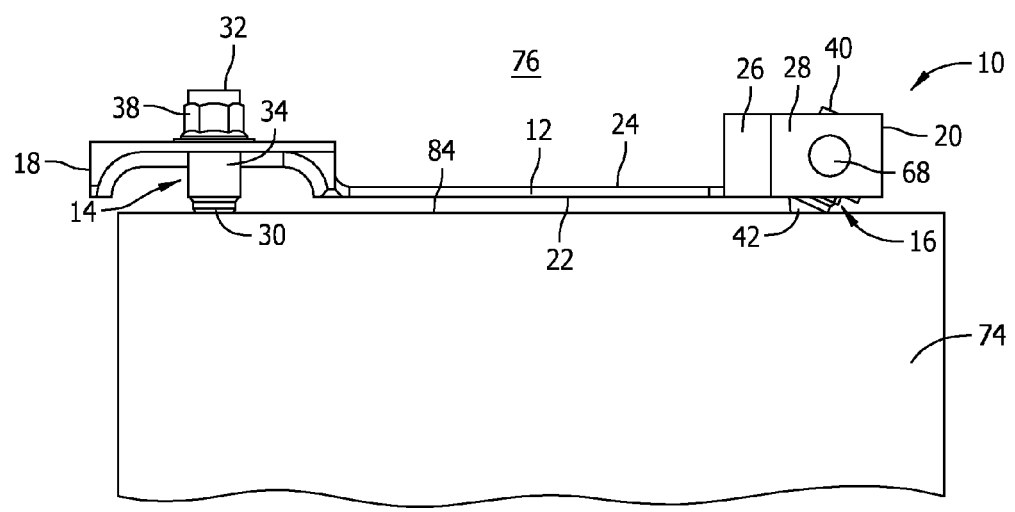
FIG. 9 is a top plan view of the apparatus shown removably mounting a device housing to a structure.

FIG. 1 is a top plan view of an embodiment of the dagger pin interface apparatus 10 of the disclosure which includes a swivel pin. FIG. 6 it is a partial perspective view of the apparatus 10 and FIG. 8 is a rear perspective view of the apparatus. As will be explained, the apparatus 10 is basically comprised of a base 12, a first dagger or mounting pin 14 and a second dagger or mounting pin 16. Each of these basic component parts of the apparatus is constructed of materials that are sufficiently strong to enable the apparatus to perform its intended functions.

Referring to FIGS. 1, 6 and 8, the base 12 is designed to be attachable to a structure to which a device is to be removably attached. The base 12 has a length between opposite first 18 and second 20 ends of the base. The base also has a substantially flat front surface 22 that is designed to engage against a substantially flat rear surface of the device that is to be removably attached to the structure using the apparatus. A rear surface 24 of the base can have a configuration that suits the attachment of the base 12 to the structure. A lower horizontal flange 26 and a upper horizontal flange 28 are provided on the base 12 adjacent the base second end 20. The flanges 26, 28 have opposed, parallel horizontal surfaces with a vertical spacing between the surfaces that is dimensional to receive the second pin, as will be explained. The flanges 26, 28 also have coaxial holes (not shown) through the flanges.

The first dagger pin or mounting pin 14 is connected stationary to the base 12 adjacent to the base first end 18. The first pin 14 has a length with a distal end surface 30 and an opposite proximal end surface 32. An intermediate portion 34 of the first pin separates the distal end surface 30 from the proximal end surface 32. In the illustrated embodiment of the first pin 14, the distal end surface 30 has a tapered configuration. More specifically, the distal end surface 30 has a conical configuration. The opposite proximal end surface 32 is screw threaded. The intermediate portion 34 of the first pin 14 has a cylindrical configuration, but could also have a rectangular cross-section configuration. The pin 14 has a center axis 36 that extends through the length of the pin and through the tip of the conical distal end surface 30 of the pin. As shown in FIG. 1, the pin 14 is mounted stationary to the base 12 by an internally threaded nut 38. In mounting the pin 14 to the base 12 the screw threaded proximal end surface 32 of the pin is inserted through a hole (not shown) in the base 12 and the nut 38 is screw threaded down on the pin proximal end surface 32, thereby connecting the first pin 14 stationary to the base 12. The intersection of the first pin intermediate portion 34 with the pin distal end surface 30 is positioned in a plane that also intersects the flat front surface 22 of the base 12. With the first pin 14 connected to the base 12, the first pin 14 projects outwardly from the base to the distal end surface 30 of the first pin. When the base 12 is attached to a structure to which a device is to be removably attached by the apparatus 10, the first pin 14 projects outwardly and away from the structure to the first pin distal end surface 30.

The second dagger pin or mounting pin 16 is attached to the base 12 adjacent the base second end 20. The second pin 16 is attached to the base 12 for pivoting movement of the second pin relative to the base. Referring to FIGS. 2-5, the second pin 16 has a length with a proximal end surface 40 and an opposite distal end surface 42. An intermediate portion 44 of the second pin separates the proximal end surface 40 from the distal end surface 42. Like the first pin 14, the distal end surface 42 of the second pin 16 has a tapered configuration. In the embodiment shown, the second pin distal end surface 42 has a conical configuration. The second pin proximal end surface 40 is flat. The intermediate portion 44 of the second pin 16 has a rectangular cross-section with opposite flat and parallel top 46 and bottom 48 surfaces and opposite flat and parallel side surfaces 50, 52. One of the side surfaces 52 has a pair of ridges 54 that project outwardly from the side surface at the front and rear of the side surface. A hole 56 extends through the second pin 16 between the opposite top 46 and bottom 48 surfaces of the pin. The hole 56 has a center axis 58 that is perpendicular to the opposite top 46 and bottom 48 surfaces. The hole 56 is also centered in the opposite top 46 and bottom 48 surfaces. The hole axis 58 functions as a pivot axis of the second pin 16 as will be explained. The second pin 16 also has a center axis 60 that extends through the length of the second pin 16 and through the tip of the conical distal and surface 42 of the pin. The second pin center axis 60 is perpendicular to and intersects the hole axis 58. As with the first pin 14, the second pin distal end surface 42 intersects the intermediate portion 44 of the second pin in a plane that is also coplanar with the front surface 22 of the base 12.

Figure 5:
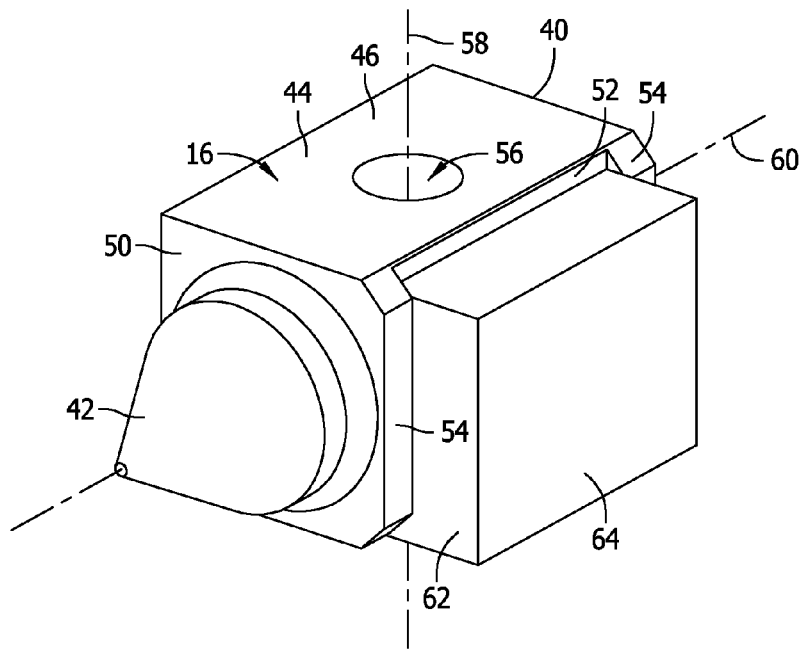
FIG. 5 is a perspective view of the swivel pin with a biasing device attached.

Referring to FIG. 5, a biasing device 62 is secured to the side surface 52 of the second pin 16 between the pair of ridges 54. In the illustrated embodiment, the biasing device 62 is a rectangular compressible pad that is secured to the side surface 52 of the second pin 16 between the ridges 54. The pad 62 has a general rectangular configuration and extends outwardly from the second pin side surface 52 to an exterior surface 64 of the pad.

Figure 7:
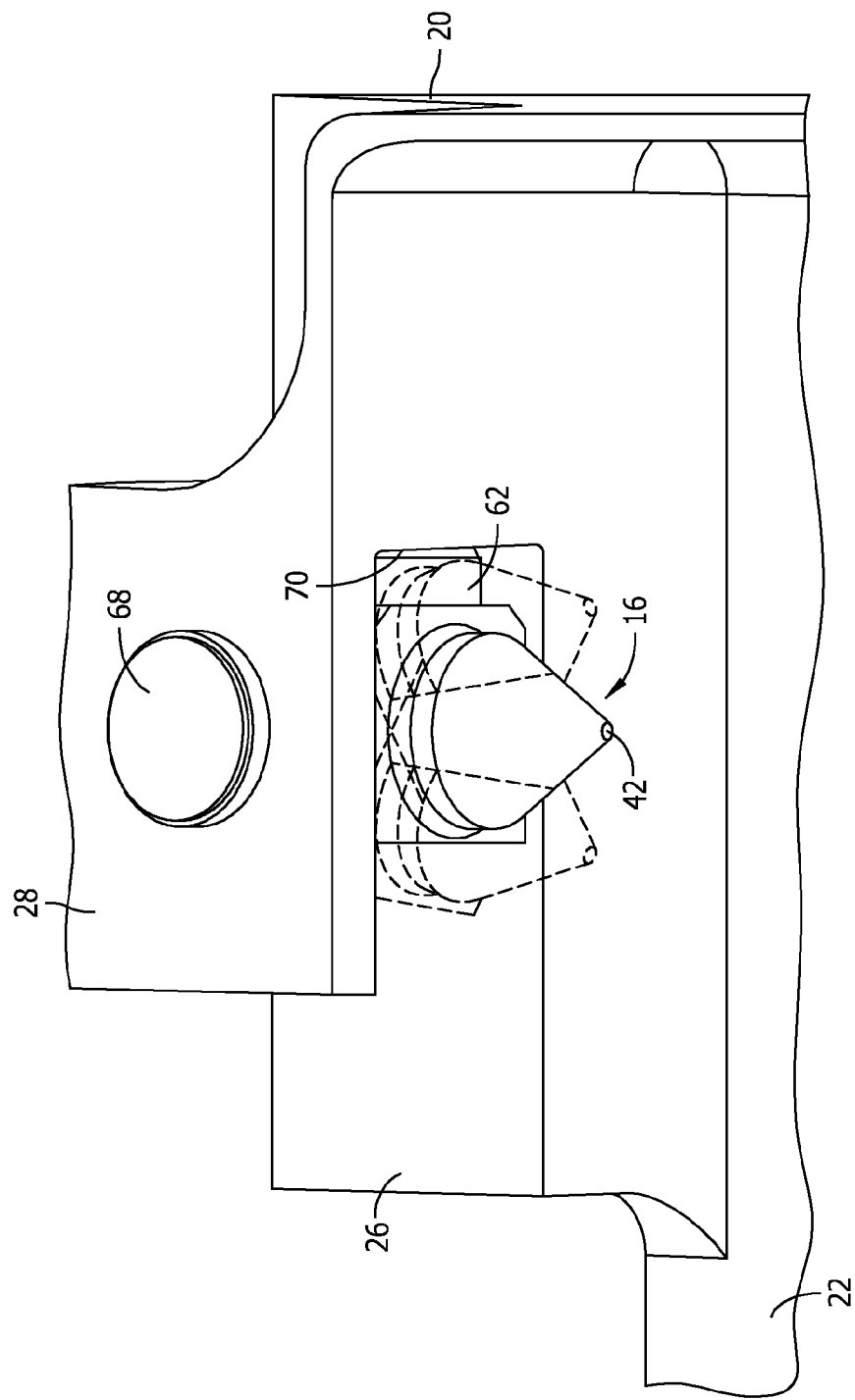
FIG. 7 is a view similar to that of FIG. 6 but showing the range of the pivoting movement of the swivel pin.

Referring to FIGS. 1 and 6, the second pin 16 is secured to the base 12 by a pivot post 68. In attaching the second pin 16 to the base 12, the second pin 16 is first positioned between the lower flange 26 and upper flange 28 of the base with the hole 56 through the second pin being aligned with the coaxial holes in the two flanges. The compressible pad 62 is positioned between the two flanges 26, 28 and adjacent a side surface 70 of the base extending between the two flanges. The pivot post 68 is inserted through the aligned holes of the two flanges 26, 28 and the hole 56 of the second pin 16. Opposite ends of the pivot post 68 are secured to the two flanges 26, 28. The pivot post 68 thereby connects the second pin 16 to the base 12 for pivoting movement of the second pin relative to the base about the pivot post 68 and the second pin hole center axis 58. The hole center axis or pivot axis 58 is oriented vertically and the second pin 16 can swivel about the pivot axis 58 from side to side toward and away from the first pin 14 as represented in FIG. 7.

With the second pin 16 connected to the base 12 by the pivot post 68, the compressible pad 62 is in close proximity to the base side surface 70 that extends between the two flanges 26, 28. The compressible pad 62 lightly engages against the side surface 70 to position the second pin 16 at a neutral orientation or position on the base 12. In the neutral position the center axis 60 of the second pin 16 is substantially parallel to the center axis 36 of the first pin 14. When a force is exerted on the second pin distal end surface 42 that causes the second pin to pivot away from the neutral position of the second pin, the compressible pad 62 is compressed against the base side surface 70. When the force causing the second pin 16 to pivot is removed, the resiliency of the compressible pad 62 pushes the second pin 16 back to its neutral position relative to the base 12.

Figure 10:
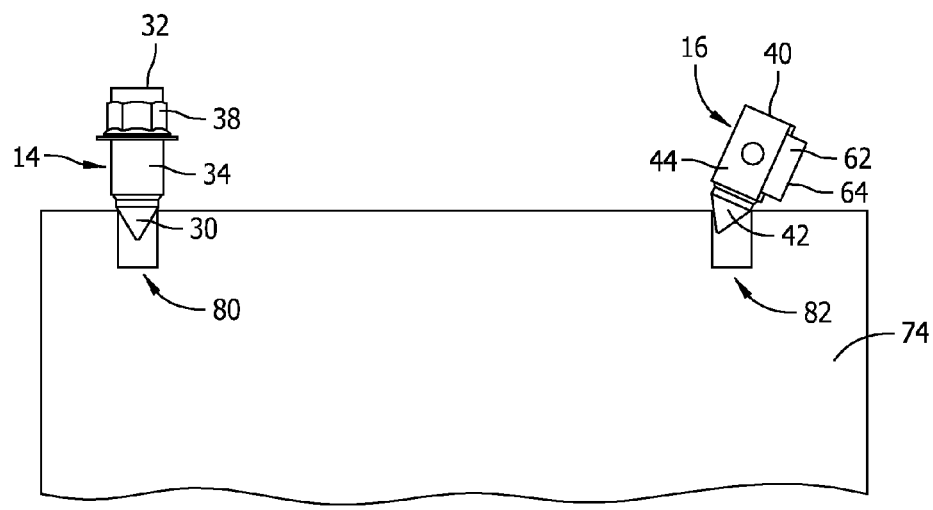
FIG. 10 is a top plan view of the apparatus similar to that of FIG. 8, but with the base of the apparatus removed.

FIGS. 1 and 8-10 illustrate a method of using the apparatus 10 for removably mounting a device 74 to a separate structure 76 where the device has a first mounting hole 80 and a second mounting hole 82 in a rear surface 84 of the device. The structure 76, is represented schematically in FIG. 1 and is not shown in FIGS. 8-10. According to the method, the base 12 of the apparatus is first securely attached stationary to the structure 76 in any conventional manner. With the base 12 securely attached to the structure 76, the first pin 14 and second pin 16 project outwardly away from the base 12 and the structure 76 to their respective distal end surfaces 30, 42. The device 74 is then positioned relative to the base 12 where the first mounting hole 80 in the device rear surface 84 is aligned with the first pin 14 of the apparatus 10. The second mounting hole 82 in the device rear surface 84 may or may not be completely aligned with the second pin 16 of the apparatus. The device 74 is then moved toward the first 14 and second 16 pins with the device first mounting hole 80 passing over the distal end surface 30 of the first pin 14. This movement of the device 74 onto the first pin 14 will cause the second mounting hole 82 in the device rear surface 84 to engage with the distal end surface 42 of the second pin 16 as represented in FIG. 10. Continued movement of the device 74 toward the base 12 will cause the device first mounting hole 80 to pass over the first pin 14 and cause the device second mounting hole 82 to slide over the distal end surface 42 of the second pin 16. If the second mounting hole 82 is not completely aligned with the second pin 16, the tapered distal end surface 42 of the second pin 16 will cause the second pin to pivot about the pivot post 68 and the pivot axis 58 as the second mounting hole 82 is passed over the second pin. This pivoting movement of the second pin 16 directs the second pin distal end surface 42 into the second mounting hole 82 of the device.

With the first 14 and second 16 pins of the apparatus engaged in the respective first 80 and second 82 mounting holes of the device 74, latches (not shown) on the opposite front surface of the device can be engaged with swing bolts on the structure 76 in a conventional manner. The swing bolts can then be tightened down on the latches to removably mount the device 74 to the structure 76.

To remove the device 74 from the structure 76, the swing bolts are removed from the latches on the front surface of the device. The device 74 can then be withdrawn from the apparatus 10. As the device first 80 and second 82 mounting holes are removed from the respective first 14 and second 16 pins, the force holding the second pin 16 in its pivoted position is removed and the resiliency of the compressible pad 62 moves the second pin 16 to its neutral position relative to the first pin 14.

As various modifications could be made to the apparatus of the disclosure and its method of use described and illustrated herein without departing from the scope of the disclosure, it is intended that all matter contained in the foregoing description or shown in the drawing figures be interpreted as illustrative rather than limiting. Thus, the breadth and scope of the present disclosure should not be limited by any of the above described exemplary embodiments, but should be defined only in accordance with the following claims appended hereto and their equivalents.

The invention claimed is:

1. An apparatus for mounting a removable device to a structure, the apparatus comprising:
    a first pin that is attachable to the structure where the first pin is stationary relative to the structure, the first pin having a distal end surface that is configured for engaging in a first hole in a surface of the device;
    a second pin that is attachable to the structure for pivoting movement of the second pin about a pivot axis relative to the structure, the second pin having a distal end surface that is configured, for engaging in a second hole in the surface of the device and causing the second pin to pivot about the pivot axis as the first and second pin distal end surfaces are engaged in the respective first and second holes in the surface of the device;
    the first pin having a center axis that passes through the first pin distal end surface;
    the second pin having a center axis that passes through the second pin distal end surface; and,
    a biasing device acting on the second pin, the biasing device urging the second pin to pivot about the pivot axis to a neutral position of the second pin relative to the first pin where the first pin center axis and the second pin center axis are substantially parallel.

2. The apparatus of claim 1, further comprising:
    the biasing device being compressible.

3. The apparatus of claim 1, further comprising:
    the biasing device being a compressible pad.

4. The apparatus of claim 1, further comprising:
    the pivot axis being oriented vertically.

5. The apparatus of claim 1, further comprising:
    the second pin distal end surface having a tapered configuration.

6. The apparatus of claim 1, further comprising:
    the second pin distal end surface having a conical configuration.

7. The apparatus of claim 1, further comprising:
    the second pin having a center axis that passes through the distal end surface of the second pin; and,
    the center axis being perpendicular to the pivot axis.

8. The apparatus of claim 7, further comprising:
    a hole through the second pin, the hole being coaxial with the pivot axis and intersecting the second pin center axis; and,
    a pivot post extending through the hole.

9. The apparatus of claim 8, further comprising:
    the pivot post being oriented vertically.

10. An apparatus for mounting a removable device to a structure where the removable device has a surface with at least a first hole and a second hole, the apparatus comprising:
    a base that is attachable to the structure with the base being secured stationary relative to the structure when the base is attached to the structure,
    a first pin connected stationary to the base, the first pin projecting outwardly from the base to a distal end surface of the first pin, the first pin projecting outwardly and away from the structure when the base is attached to the structure, the first pin being positioned on the base for the first pin distal end surface to engage in the first hole of the removable device when mounting the removable device to the structure;

a second pin connected to the base for pivoting movement of the second pin about a pivot axis relative to the base, the second pin projecting outwardly from the base to a distal end surface of the second pin, the second pin projecting outwardly and away from the structure when the base is attached to the structure, the second pin being positioned on the base for the second pin distal end surface to engage in the second hole of the removable device when mounting the removable device to the structure.

11. The apparatus of claim 10, further comprising:
the pivot axis being oriented vertically.

12. The apparatus of claim 10, further comprising:
the second pin distal end surface having a tapered configuration.

13. The apparatus of claim 10, further comprising:
the second pin distal end surface having a conical configuration.

14. The apparatus of claim 10, further comprising:
the second pin having a center axis that passes through the distal end surface of the second pin; and,
the center axis being perpendicular to the pivot axis.

15. The apparatus of claim 14, further comprising:
a hole through the second pin, the hole being coaxial with the pivot axis and intersecting the second pin center axis; and,
a pivot post extending through the hole.

16. The apparatus of claim 15, further comprising:
the pivot post being oriented vertically.

17. The apparatus of claim 10, further comprising:
the first pin having a center axis that passes through the first pin distal end surface;
the second pin having a center axis that passes through the second pin distal end surface; and,
a biasing device acting on the second pin, the biasing device urging the second pin to pivot about the pivot axis to a neutral position of the second pin relative to the first pin where the first pin center axis and the second pin center axis are substantially parallel.

18. The apparatus of claim 17, further comprising:
the biasing device being a compressible pad.

19. A method of mounting a removable device to a structure, the method comprising the steps of:
attaching a first pin to the structure where the first pin is stationary relative to the structure;
providing the first pin with a distal end surface that is configured for engaging in a first hole in a surface of the device;
attaching a second pin to the structure where the second pin pivots about a pivot axis relative to the structure;
providing the second pin with a distal end surface that is configured for engaging in a second hole in the surface of the device; and,
causing the second pin to pivot about the pivot axis as the first and second pin distal end surfaces are engaged in the respective first and second holes in the surface of the device while mounting the device to the structure.

* * * * *